United States Patent
Li et al.

(10) Patent No.: US 9,861,005 B2
(45) Date of Patent: Jan. 2, 2018

(54) COOLING SYSTEM FOR A HAND-HELD ELECTRONIC DEVICE

(71) Applicant: Sunonwealth Electric Machine Industry Co., Ltd., Kaohsiung (TW)

(72) Inventors: Ming-Tsung Li, Kaohsiung (TW); Shih-Hang Lin, Kaohsiung (TW)

(73) Assignee: Sunonwealth Electric Machine Industry Co., Ltd., Kaohsiung (TW)

( * ) Notice: Subject to any disclaimer, the term of this patent is extended or adjusted under 35 U.S.C. 154(b) by 896 days.

(21) Appl. No.: 14/177,303

(22) Filed: Feb. 11, 2014

(65) Prior Publication Data
US 2014/0235156 A1    Aug. 21, 2014

(30) Foreign Application Priority Data
Feb. 21, 2013    (TW) .............................. 102106037 A

(51) Int. Cl.
*H05K 7/20* (2006.01)
*G06F 1/20* (2006.01)

(52) U.S. Cl.
CPC ......... *H05K 7/20154* (2013.01); *G06F 1/203* (2013.01)

(58) Field of Classification Search
CPC ........................... H05K 7/20154; G06F 1/203
USPC ................................................ 454/184, 370
See application file for complete search history.

(56) References Cited

U.S. PATENT DOCUMENTS

| | | | |
|---|---|---|---|
| 6,430,042 B1 * | 8/2002 | Ohashi | G06F 1/203 165/104.33 |
| 7,580,265 B2 | 8/2009 | Kumagai et al. | |
| 8,125,778 B2 * | 2/2012 | Miyoshi | H05K 7/20145 361/679.49 |
| 8,477,490 B2 | 7/2013 | Rothkopf et al. | |
| 8,553,409 B2 | 10/2013 | Rehmann et al. | |
| 2005/0094371 A1 * | 5/2005 | Lai | G06F 1/203 361/679.48 |
| 2008/0094802 A1 | 4/2008 | Kumagai et al. | |
| 2009/0323275 A1 | 12/2009 | Rehmann et al. | |
| 2012/0224324 A1 | 9/2012 | You | |
| 2012/0270034 A1 * | 10/2012 | Chueh | H01L 23/3735 428/334 |

FOREIGN PATENT DOCUMENTS

EP    1521164 A2    4/2005

* cited by examiner

*Primary Examiner* — Gregory Huson
*Assistant Examiner* — Dana Tighe
(74) *Attorney, Agent, or Firm* — Alan D. Kamrath; Kamrath IP Lawfirm, P.A.

(57) ABSTRACT

A cooling system for a hand-held electronic device includes a casing including a compartment, at least one air inlet in communication with the compartment, and at least one air outlet in communication with the compartment. A wind driving assembly is mounted in the compartment and includes a frame, a package, and a thermally conductive cover. The thermally conductive cover engages with the frame and the package. An impeller is rotatably arranged in the frame having an outlet hole adjacent to the at least one air outlet. The package receives at least one electronic element that generates heat during operation. The thermally conductive cover includes an inlet hole in communication with an interior of the frame. An air channel is formed between the thermally conductive cover and an interior wall face of the casing. The at least one air inlet intercommunicates with the inlet hole via the air channel.

23 Claims, 9 Drawing Sheets

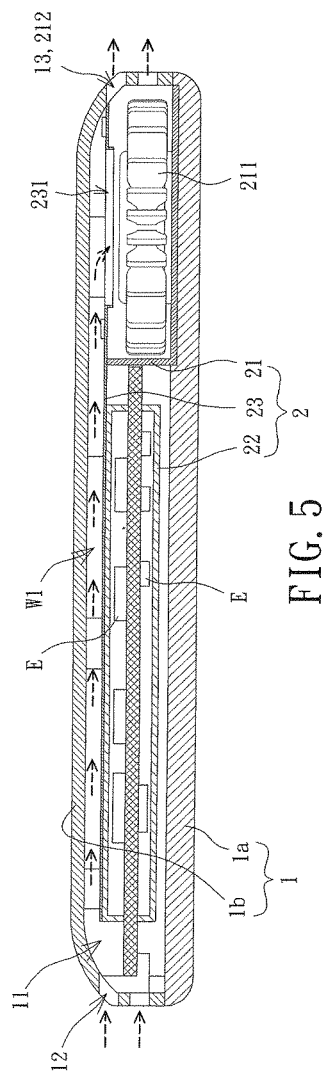
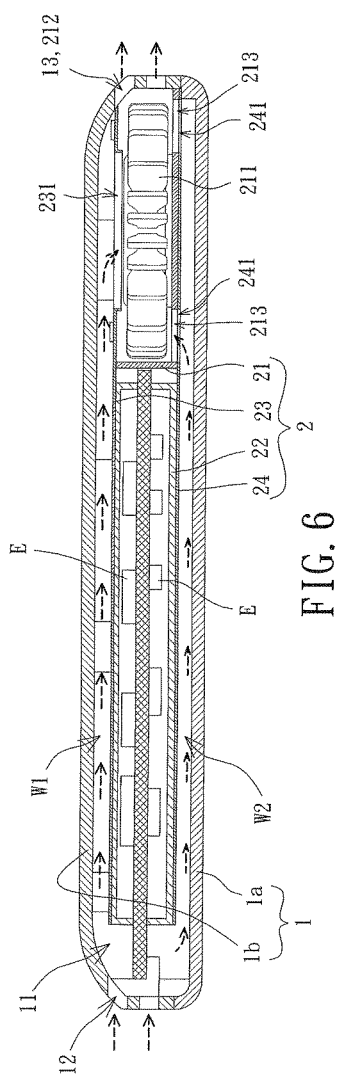
FIG. 5
FIG. 6

COOLING SYSTEM FOR A HAND-HELD ELECTRONIC DEVICE

BACKGROUND OF THE INVENTION

1. Field of the Invention

The present invention relates to a cooling system for a hand-held electronic device and, more particularly, to a cooling system that can easily be applied in a hand-held electronic device while providing an enhanced cooling effect.

2. Description of the Related Art

FIG. 1 shows a conventional hand-held electronic device 8 including an enclosure 81 defining a compartment in which at least one processor is received. The enclosure 81 includes a peripheral wall having a receiving port 811. A fan received in the enclosure 81 can be operated to make air flow through the receiving port 811 for exchanging the air in the compartment with the ambient air surrounding the enclosure 81, thereby cooling the processor. An example of such a hand-held electronic device 8 is disclosed in U.S. Pat. No. 8,477,490 B2.

FIG. 2 shows a conventional cell phone 9 including a casing 91 receiving at least one electronic element 92. The casing 91 includes a peripheral wall having a plurality of vents 911. A fan 93 is mounted in a location adjacent to each vent 911 and can be operated to cool the at least one electronic element 92 by exchanging the air inside the casing 91 with the air outside the casing 91. An example of such a cell phone 9 is disclosed in Taiwan Patent Publication No. 201238317.

Electronic elements such as processors are generally mounted in the hand-held electronic device 8 and the cell phone 9, and fans are used to cool the electronic elements. However, due to limited spaces in the enclosure 81 and the casing 91, it is impossible to cool the electronic elements by driving air currents through air channels without proper arrangements of the fans and the electronic elements. Thus, the cooling effects of the hand-held electronic device 8 and the cell phone 9 are poor.

Thus, a need exists for a novel cooling system that can be used in various hand-held electronic devices to solve the above problems.

SUMMARY OF THE INVENTION

An objective of the present invention is to provide a cooling system for a hand-held electronic device that can easily be installed while providing an enhanced cooling effect.

The present invention fulfills the above objective by providing, in an aspect, a cooling system for a hand-held electronic device including a casing including a compartment, at least one air inlet in communication with the compartment, and at least one air outlet in communication with the compartment. A wind driving assembly is mounted in the compartment and includes a frame, a package, and a thermally conductive cover. The thermally conductive cover engages with the frame and the package. An impeller is rotatably arranged in the frame. The frame includes an outlet hole adjacent to the at least one air outlet of the casing. The package is adapted to receive at least one electronic element. The at least one electronic element generates heat during operation. The thermally conductive cover includes an inlet hole in communication with an interior of the frame. An air channel is formed between the thermally conductive cover and an interior wall face of the casing. The at least one air inlet of the casing intercommunicates with the inlet hole of the thermally conductive cover via the air channel.

In an example, the frame and the package adjoin each other and are located side by side, and the thermally conductive cover integrally extends from the frame to the package.

In another example, the frame and the package adjoin each other and are located side by side, and the thermally conductive cover integrally extends from the package to the frame.

In an example, an auxiliary thermally conductive cover is mounted to a side of the frame opposite to the thermally conductive cover. An auxiliary air channel is formed between the auxiliary thermally conductive cover and the interior wall face of the casing. The frame further includes at least one auxiliary inlet hole intercommunicating with the at least one air inlet of the casing via the auxiliary air channel. The auxiliary thermally conductive cover includes at least one through-hole aligned with the at least one auxiliary inlet hole.

In another example, a conduit is connected between the outlet hole of the frame and the at least one air outlet of the casing.

In a further example, an auxiliary fan is mounted in the casing and includes an inlet hole and an outlet hole. The inlet hole of the auxiliary fan is located adjacent to the at least one air inlet of the casing. An air guiding gap is formed between the auxiliary fan and the package. The air guiding gap adjoins the outlet hole of the auxiliary fan.

In an example, a side of the wind driving assembly adjacent to the auxiliary fan includes an airflow guiding portion in the form of an inclined face or an arc-like face.

In another example, an auxiliary thermally conductive cover is mounted to a side of the frame opposite to the thermally conductive cover. An auxiliary air channel is formed between the auxiliary thermally conductive cover and the interior wall face of the casing. Each of the thermally conducting cover and the auxiliary thermally conducting cover has at least one airflow guiding hole located in an adjoining area between the frame and the package.

Preferably, a side of the wind driving assembly adjacent to the auxiliary fan includes an airflow guiding portion in the form of two inclined faces or two arc-like faces opposite to each other.

Preferably, the casing further includes a side having an auxiliary air inlet and an auxiliary air outlet. The auxiliary air inlet is aligned with the auxiliary fan. The auxiliary air outlet is aligned with the frame. The frame includes an auxiliary outlet hole aligned with the auxiliary air outlet.

Preferably, the thermally conductive cover includes a surface coated with a far infrared powder coating or a powder coating of negative ions.

Preferably, the auxiliary thermally conductive cover includes a surface coated with a far infrared powder coating or a powder coating of negative ions.

In another aspect, a cooling system for a hand-held electronic device includes a casing including a compartment, at least one air inlet in communication with the compartment, and at least one air outlet in communication with the compartment. A wind driving assembly is mounted in the compartment and includes a frame, a package, and a thermally conductive cover. The frame, the package, and the thermally conductive cover are integrally formed as a housing of the wind driving assembly. An impeller is rotatably arranged in the frame. The frame includes an outlet hole adjacent to the at least one air outlet of the casing. The package is adapted to receive at least one electronic element.

The at least one electronic element generates heat during operation. The thermally conductive cover includes an inlet hole in communication with an interior of the frame. An air channel is formed between the thermally conductive cover and an interior wall face of the casing. The at least one air inlet of the casing intercommunicates with the inlet hole of the thermally conductive cover via the air channel.

The present invention will become clearer in light of the following detailed description of illustrative embodiments of this invention described in connection with the drawings.

BRIEF DESCRIPTION OF THE DRAWINGS

The illustrative embodiments may best be described by reference to the accompanying drawings where:

FIG. 5 is a cross sectional view taken along section line 5-5 of FIG. 4.

FIG. 6 is a cross sectional view of a hand-held electronic device including a cooling system of another embodiment according to the present invention.

DETAILED DESCRIPTION OF THE INVENTION

A cooling system for a hand-held electronic device according to the present invention can be used in a hand-held electronic device that generates heat during operation, such as a cell phone, a tablet computer, a hand-held game console, a music player, a digital video cassette camcorder, or a digital camera. The cooling system is particularly suitable for a hand-held electronic device in providing an excellent cooling effect.

Figure 2:
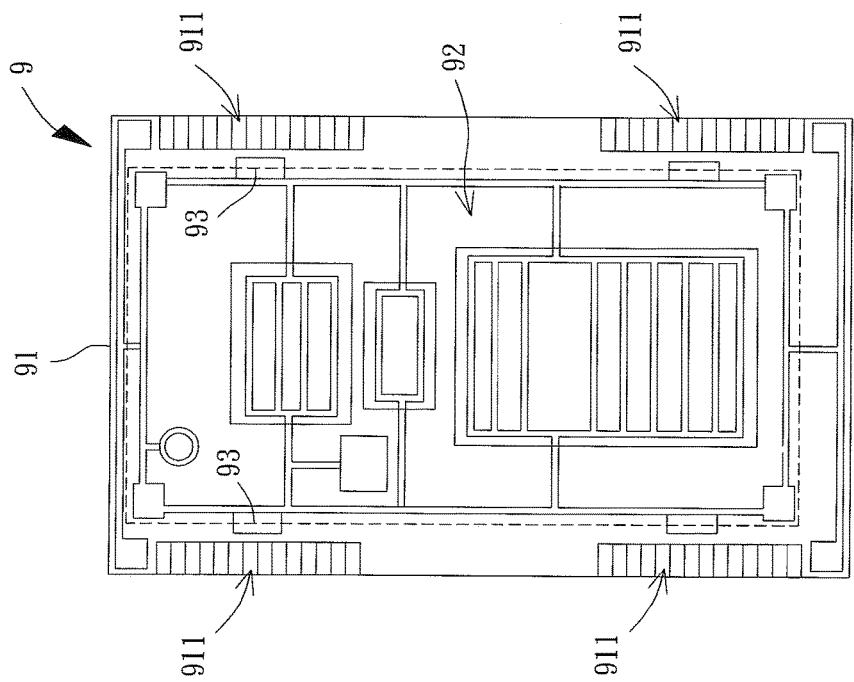
FIG. 2 is a schematic view of a conventional cell phone.
Figure 1:
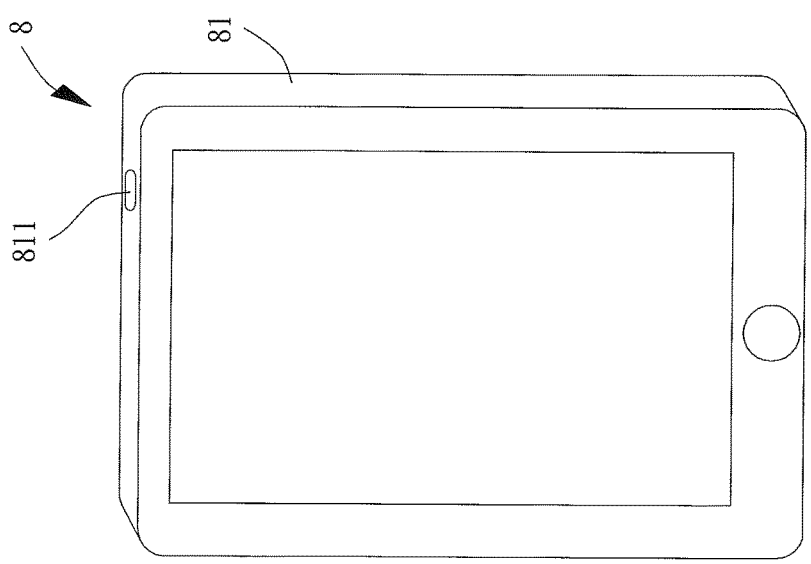
FIG. 1 is a perspective view of a conventional hand-held electronic device.
Figure 3:
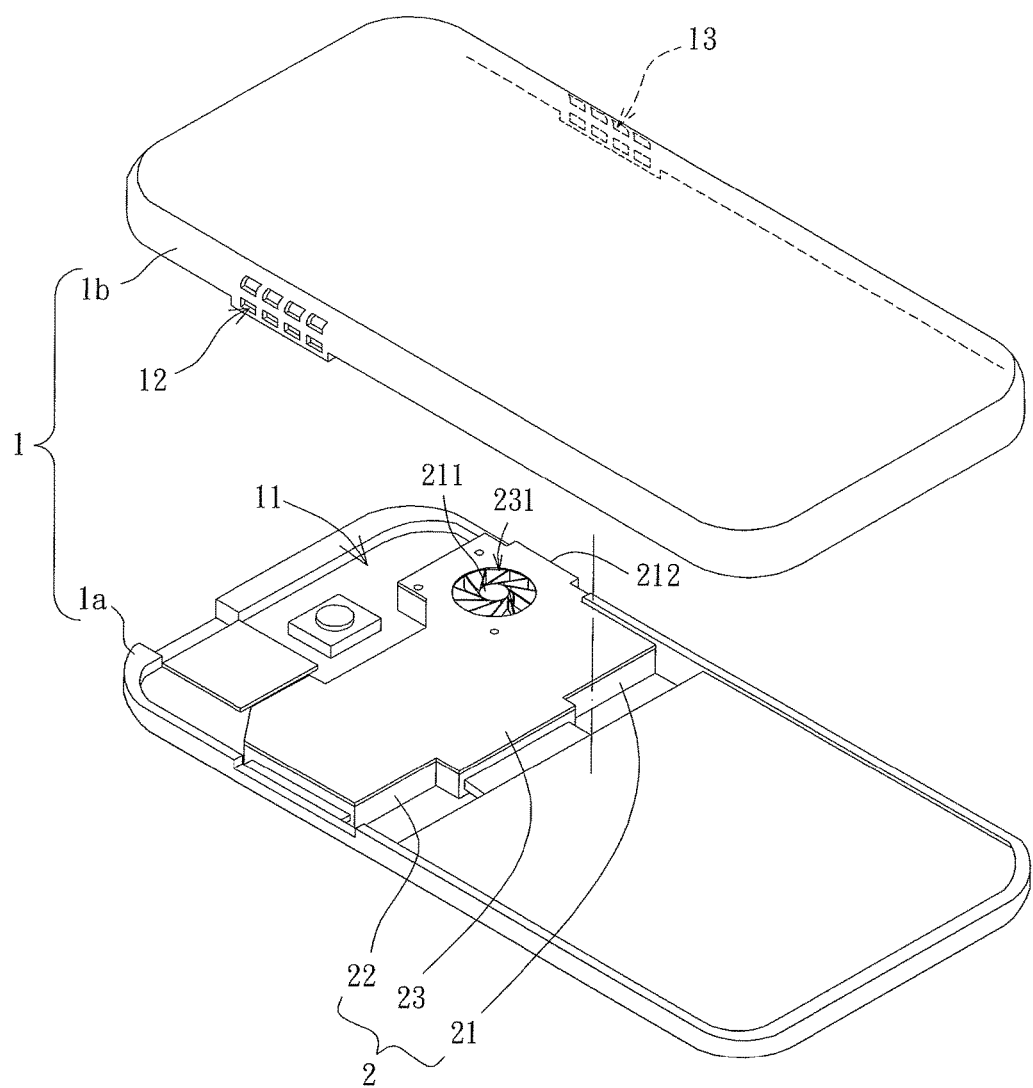
FIG. 3 is an exploded, perspective view of a hand-held electronic device including a cooling system of an embodiment according to the present invention.
Figure 4:
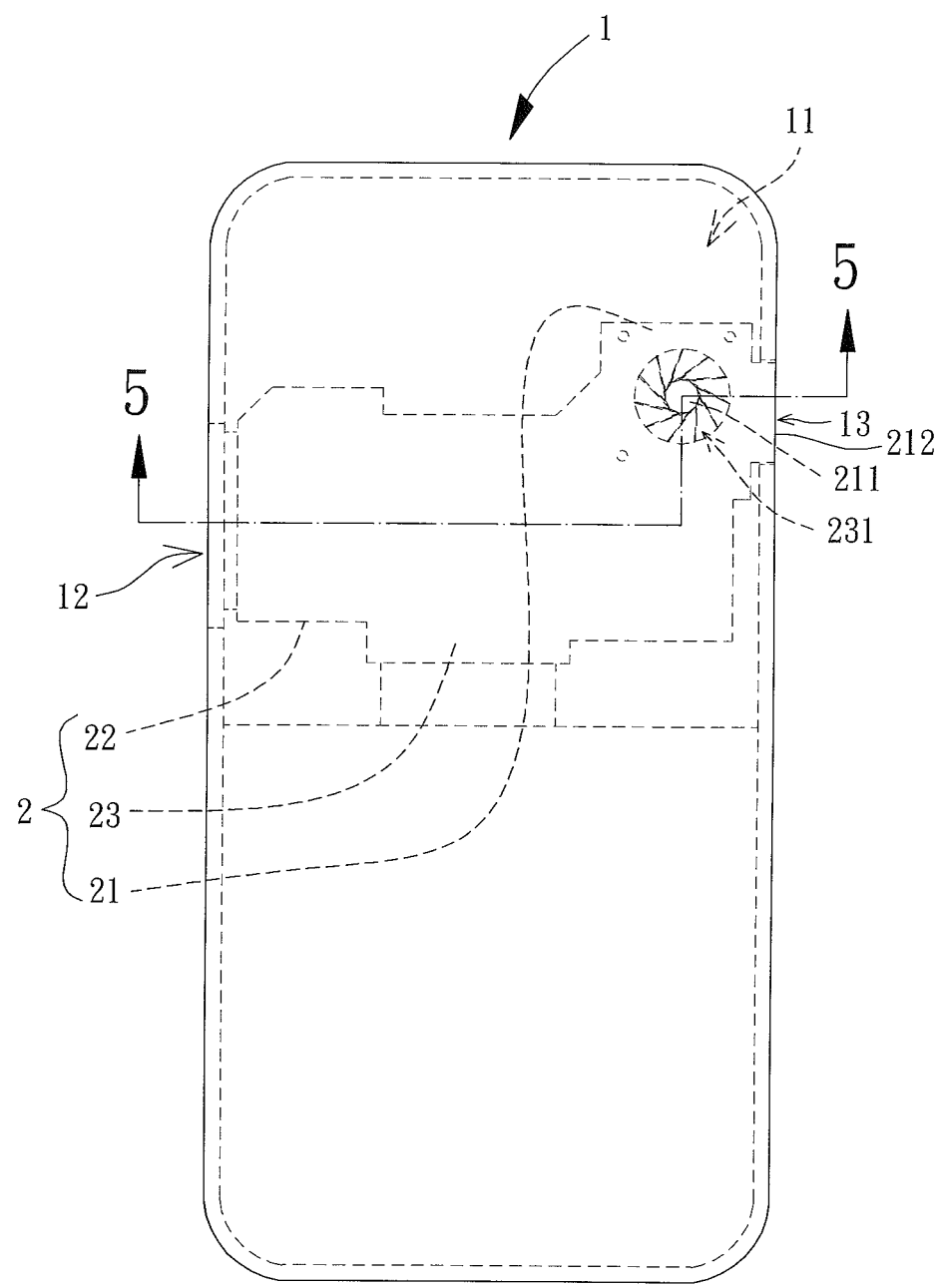
FIG. 4 is a plane view of the hand-held electronic device of FIG. 3 after assembly.

FIGS. 3-5 show a hand-held electronic device including a cooling system of an embodiment according to the present invention. The cooling system includes a casing 1 and a wind driving assembly 2 mounted in an interior of the casing 1. Specifically, the casing 1 includes a compartment 11, at least one air inlet 12 in communication with the compartment 11, and at least one air outlet 13 in communication with the compartment 11. Preferably, the at least one air inlet 12 and the at least one air outlet 13 are formed in a peripheral wall of the casing 1. Furthermore, the numbers of the at least one air inlet 12 and the at least one air outlet 13 are not limited as long as the air can flow into and out of the casing 1 without hindrance.

Based on the above concept, the casing 1 can be for any type of hand-held electronic device and can have any desired shape. In this embodiment, the casing 1 is in the form of a casing of a cell phone. Specifically, the casing 1 includes a front casing 1a and a rear casing 1b matching the front casing 1a, with the front casing 1a and the rear casing 1b together defining the compartment 11. A person skilled in the art can appreciate that the casing 1 is not limited by the form shown and can be replaced according to needs.

With reference to FIG. 3, the wind driving assembly 2 is mounted in the compartment 11. Preferably, the wind driving assembly 2 includes a frame 21, a package 22, and a thermally conductive cover 23. The frame 21 and the package 22 adjoin each other and are located side by side. The thermally conductive cover 23 engages with the frame 21 and the package 22. Alternatively, the frame 21, the package 22, and the thermally conductive cover 23 are integrally formed as a housing of the wind driving assembly 2. Namely, the housing of the wind driving assembly 2 is an integrally formed structure.

The frame 21 can be a fan seat. In the embodiment shown, an impeller 211 is rotatably arranged in the frame 21 and can be driven by a stator coil, a driving circuit, and other basic parts of a fan to rotate in the frame 21. The frame 21 includes an outlet hole 212 adjacent to the at least one air outlet 13 of the casing 1. In the embodiment shown, the outlet hole 212 is aligned with the at least one air outlet 13. Preferably, the outlet hole 212 is defined in a lateral wall of the frame 21 to allow discharge of air flowing through the interior of the frame 21.

The package 22 is adapted to receive at least one electronic element E (FIG. 5). The at least one electronic element E generates heat during operation. The package 22 completely envelopes the at least one electronic element E. In this embodiment, the package 22 and the frame 21 are located side by side.

The thermally conductive cover 23 can be engaged with the package 22 and the frame 21 by any suitable provision, such as welding and screwing. Furthermore, the thermally conductive cover 23 can be an extension of a top cover of a fan seat and can integrally extend from the frame 21 to the package 22. Alternatively, the thermally conductive cover 23 can be an extension of a top of a slotted seat for a package and can integrally extend from the package 22 to the frame 21. By such arrangements, the assembling convenience can be increased while enhancing the cooling effect.

In this embodiment, the thermally conductive cover 23 is a metal cover having excellent properties in heat absorption and thermal conduction to absorb the heat generated by the at least one electronic element E. Preferably, the thermally conductive cover 23 can include a magnetically conductive material, such as iron, to avoid electromagnetic interference. Furthermore, the thermally conductive cover 23 includes an inlet hole 231 in communication with the interior of the frame 21 such that the impeller 211 can draw in air currents via the inlet hole 231. An air channel W1 (FIG. 5) is formed between the thermally conductive cover 23 and an interior wall face of the casing 1. In the embodiment shown, a gap is preferably defined between the thermally conductive cover 23 and the interior wall face of the rear casing 1b and forms the air channel W1. The at least one air inlet 12 of the casing 1 intercommunicates with the inlet hole 231 of the thermally conductive cover 23 via the air channel W1, allowing air to flow therethrough.

With reference to FIG. 4, after assembly, the impeller 211 can be activated to drive ambient air into the compartment 11 of the casing 1 via the at least one air inlet 12, as shown in FIG. 5. The air flows through the air channel W1 to carry away the heat generated by the at least one electronic element E and absorbed by the thermally conductive cover 23. After the hot air enters the frame 21, the hot air is driven by the impeller 211 to exit the frame 21 via the outlet hole 212.

Based on the above technical concept of the cooling system for a hand-held electronic device according to the present invention, FIG. 6 shows another embodiment including a casing 1 and a wind driving assembly 2, which is substantially the same as those of the first embodiment, and the same features are not described to avoid redundancy.

In this embodiment, the frame 21 includes at least one auxiliary inlet hole 213 that is preferably formed in a bottom board of the frame 21 in the form shown. Furthermore, an auxiliary thermally conductive cover 24 mounted to a side of the frame 21 opposite to the thermally conductive cover 23. The package 22 and the frame 21 are located between the thermally conductive cover 23 and the auxiliary thermally conductive cover 24. Preferably, the auxiliary thermally conductive cover 24 is coupled to a bottom of the package 22 and the bottom board of the frame 21. An auxiliary air channel W2 is formed between the auxiliary thermally conductive cover 24 and the interior wall face of the casing 1. In the embodiment shown, a gap is defined between the auxiliary thermally conductive cover 24 and the interior wall face of the front casing 1a and forms the auxiliary air channel W2. The at least one air inlet 12 of the casing 1 intercommunicates with the at least one auxiliary inlet hole 213 via the auxiliary air channel W2 such that the auxiliary air channel W2 can extend from the at least one air inlet 12 to the at least one auxiliary inlet hole 213. Furthermore, the auxiliary thermally conductive cover 24 includes at least one through-hole 241 aligned with the at least one auxiliary inlet hole 213. Thus, the air currents driven into the compartment 11 via the at least one air inlet 12 can rapidly branch and flow through the air channel W1 and the auxiliary air channel W2. The air currents flowing through the auxiliary air channel W2 can be guided into the frame 21 via the at least one through-hole 241 and the at least one auxiliary inlet hole 213. Rotation of the impeller 211 discharges a large quantity of hot air to increase the cooling effect.

Figure 7:
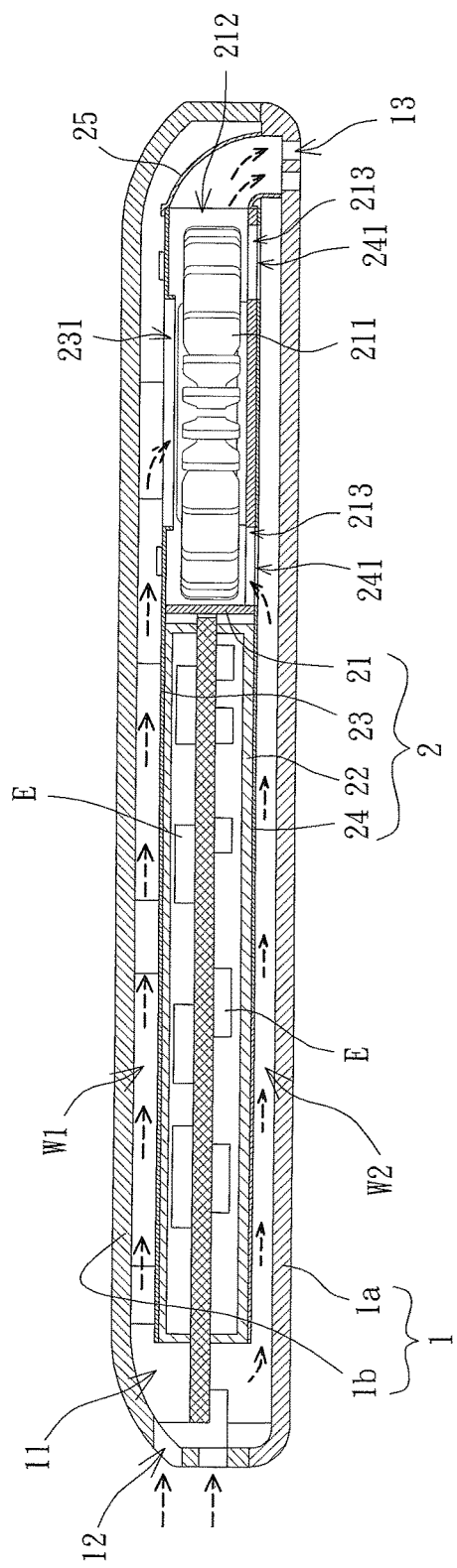
FIG. 7 is a cross sectional view of a hand-held electronic device including a cooling system of a further embodiment according to the present invention.

FIG. 7 shows a further embodiment according to the present invention. In this embodiment, a conduit 25 is connected to the frame 21. Specifically, the conduit 25 is connected to the outlet hole 212 of the frame 21 to guide the air currents passing through the outlet hole 212 to an appropriate position for discharge. In this embodiment, the at least one air outlet 13 is preferably formed in the front casing 1a such that the outlet hole 212 of the frame 21 and the at least one air outlet 13 of the front casing 1a are connected by the conduit 25. Thus, when the air currents are discharged via the at least one air outlet 13, the air currents can smoothly concentrated and guided through the conduit 25 and discharged out of the casing 1, achieving an enhanced cooling effect.

Furthermore, the thermally conductive cover 23 can include a surface coated with a far infrared powder coating or a powder coating of negative ions. Thus, when the air currents flow through the air channel W1 and pass through the surface of the thermally conductive cover 23, the air currents can be purified by the far infrared powder coating or the powder coating of negative ions, providing a purifying effect for the air currents exiting the casing 1. Likewise, the auxiliary thermally conductive cover 24 can include a surface coated with a far infrared powder coating or a powder coating of negative ions. Thus, the air currents flowing through the auxiliary air channel W2 and passing through the surface of the auxiliary thermally conductive cover 24, the air currents can be purified by the far infrared powder coating or the powder coating of negative ions, providing a purifying effect for the air currents.

In view of the foregoing, the main features of the cooling system for a hand-held electronic device according to the present invention are that by packaging the at least one electronic element E and the impeller 211 of a hand-held electronic device in the interior of the wind driving assembly 2 (namely, a miniature cooling fan and electronic elements of a hand-held electronic device are packaged as an integral component) and by cooperating with the air channel W1 formed between the thermally conductive cover 23 of the wind driving assembly 2 and the interior wall face of the casing 1, the heat generated by the at least one electronic element E can be absorbed by the thermally conductive cover 23 and can be carried away by the air flowing through the air channel W1, providing the hand-held electronic device with an enhanced cooling effect. Thus, the cooling system for a hand-held electronic device according to the present invention not only has an enhanced cooling effect but provides assembling convenience when it is mounted in various hand-held electronic devices through provision of the integrally packaged (i.e., modularized) wind driving assembly 2, allowing easy manufacture of various hand-held electronic devices.

Figure 8:
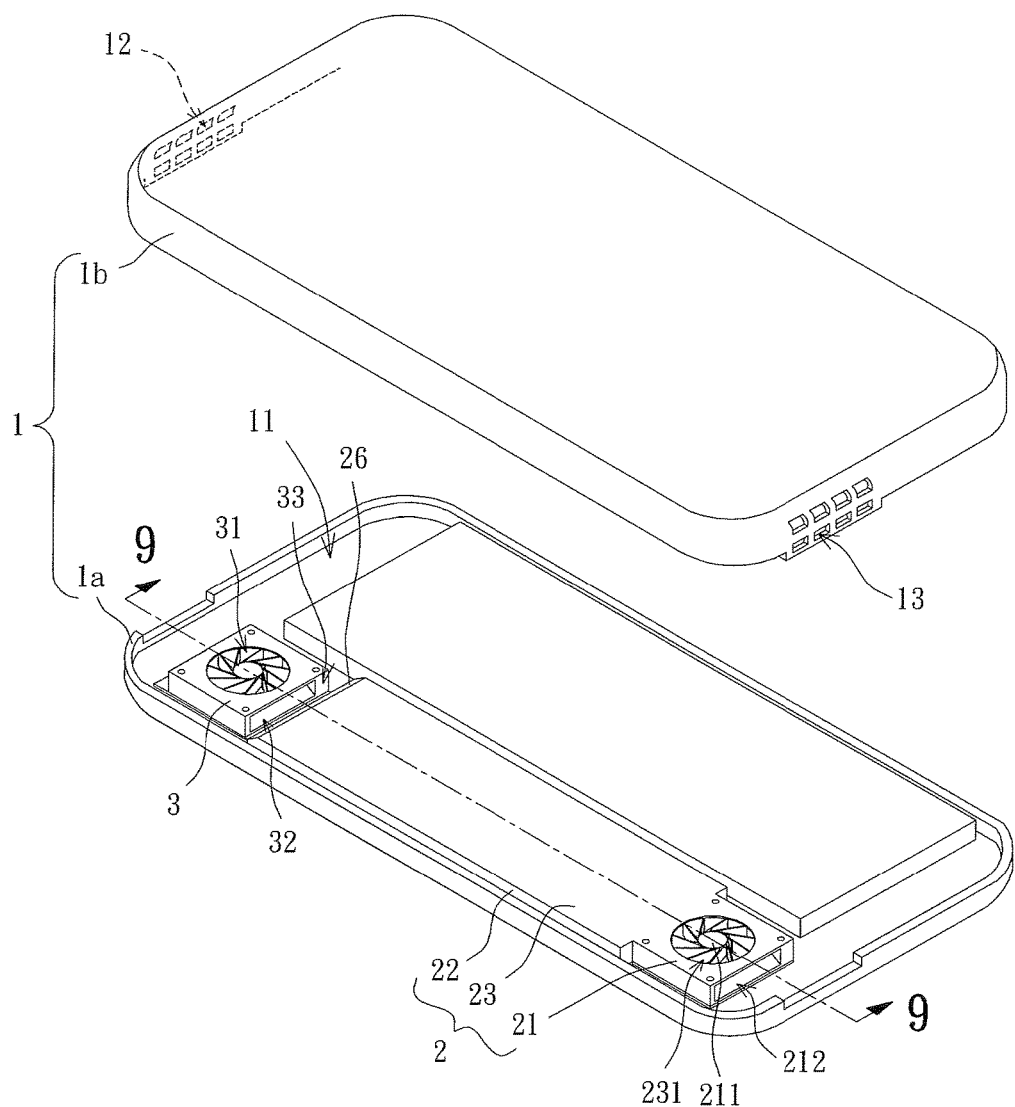
FIG. 8 is an exploded, perspective view of a hand-held electronic device including a cooling system of still another embodiment according to the present invention.
Figure 11:
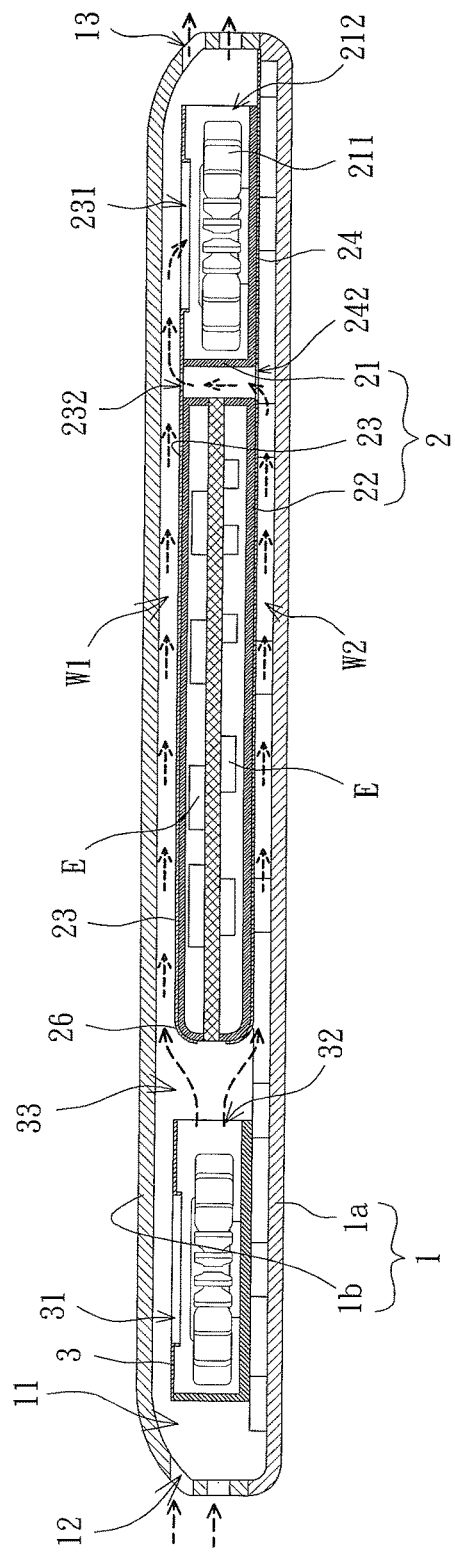
FIG. 11 is a cross sectional view taken along section line 11-11 of the hand-held electronic device of FIG. 10 after assembly.

Based on the above technical concept, the cooling system according to the present invention can further include an auxiliary fan 3 mounted in the compartment 11 of the casing 1, as shown in FIG. 8. The auxiliary fan 3 and the wind driving assembly 2 are located side by side and are preferably located on a longitudinal side of the casing 1 along a rectilinear line. The at least one air inlet 12 and the at least one air outlet 13 of the casing 1 are respectively located on two opposite sides extending perpendicularly to the longitudinal side. In this embodiment, the auxiliary fan 3 is a centrifugal fan. The auxiliary fan 3 includes an inlet hole 31 and an outlet hole 32. The inlet hole 31 of the auxiliary fan 3 is located adjacent to the at least one air inlet 12 of the casing 1. Furthermore, an air guiding gap 33 is formed between the auxiliary fan 3 and the package 22 and adjoins the outlet hole 32 of the auxiliary fan 3. In this embodiment, the wind driving assembly 2 includes a side adjacent to the auxiliary fan 3. The side of the wind driving assembly 2 includes an airflow guiding portion 26 in the form of an inclined face or an arc-like face (c.f. FIG. 11). Thus, when air currents are guided by the auxiliary fan 3 and pass through the air guiding gap 33 (see FIG. 9), the air currents can easily be guided by the airflow guiding portion 26 to flow through the air channel W1.

Figure 9:
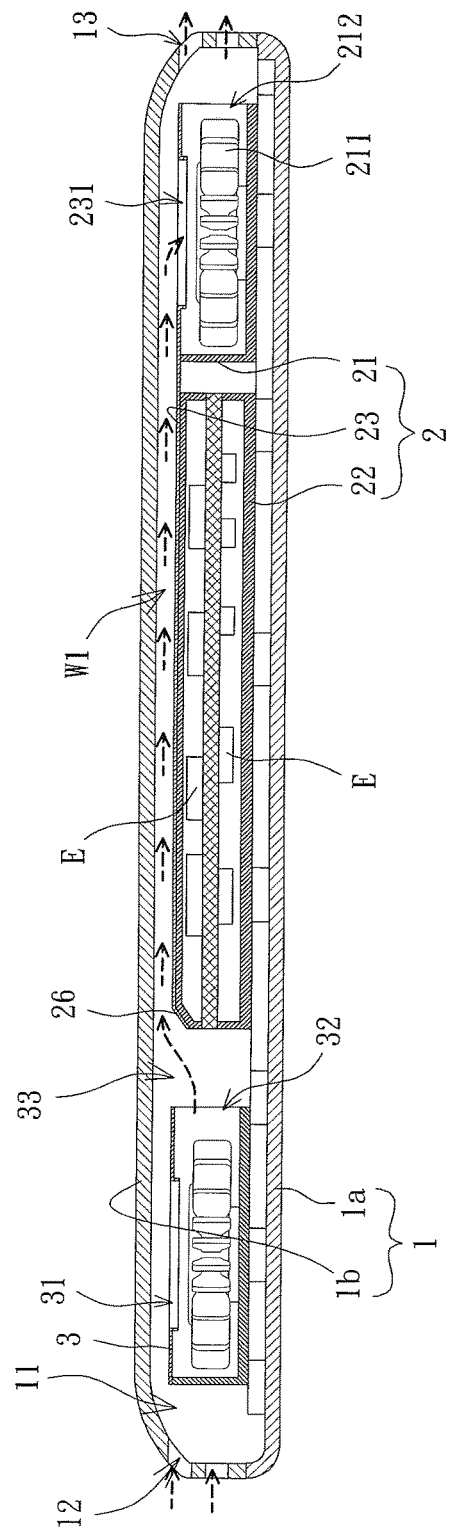
FIG. 9 is a cross sectional view taken along section line 9-9 of the hand-held electronic device of FIG. 8 after assembly.
Figure 10:
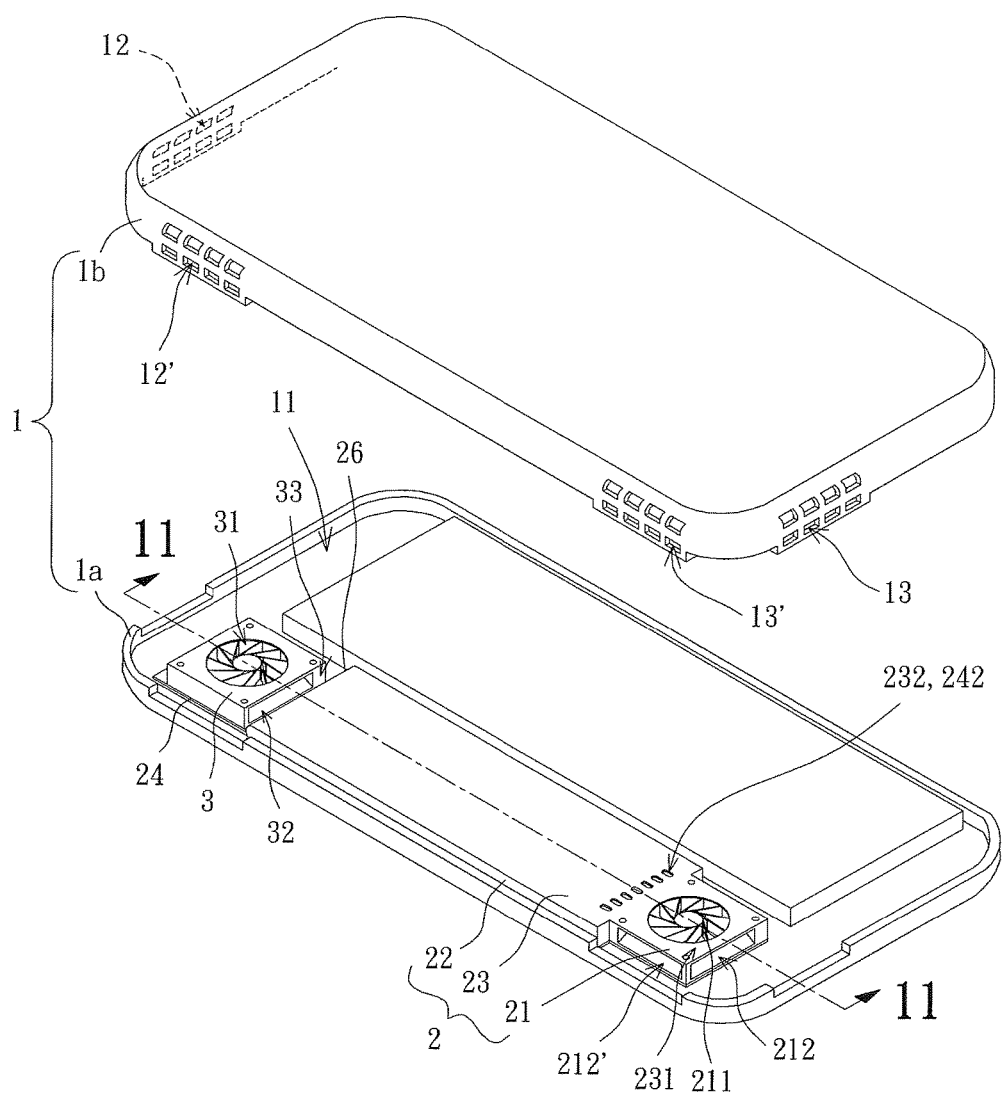
FIG. 10 is an exploded, perspective view of a hand-held electronic device including a cooling system of yet another embodiment according to the present invention.

In an alternative embodiment shown in FIGS. 10 and 11, the casing 1 further includes a side having an auxiliary air inlet 12' and an auxiliary air outlet 13'. The auxiliary air inlet 12' is aligned with the auxiliary fan 3. The auxiliary air outlet 13' is aligned with the frame 21. Preferably, the frame 21 includes an auxiliary outlet hole 212' aligned with the auxiliary air outlet 13'. Thus, the air input amount and air output amount can be increased. Furthermore, in a case that an auxiliary thermally conductive cover 24 is mounted to a side of the frame 21 opposite to the thermally conductive cover 23 to form an auxiliary air channel W2 between the auxiliary thermally conductive cover 24 and the interior wall face of the casing 1 (FIG. 11), the airflow guiding portion 26 are two arc-like faces opposite to each other or two inclined faces (c.f. FIG. 9) opposite to each other, increasing the air guiding effect. Furthermore, each of the thermally conductive cover 23 and the auxiliary thermally conductive cover 24 has at least one airflow guiding hole 232, 242. In this embodiment, each of the thermally conductive cover 23 and the auxiliary thermally conductive cover 24 includes a plurality of airflow guiding holes 232, 242. The airflow guiding holes 232 are aligned with the airflow guiding holes 242. Preferably, the airflow guiding holes 232 and 242 are located in an adjoining area between the frame 21 and the package 22. Furthermore, inclined faces or arc-like faces can be provided on corners between the package 22 and the frame 21 to guide the air currents flowing through the auxiliary air channel W2 into the air channel W1 via the airflow guiding holes 232 and 242. Thus, the air currents flowing through the auxiliary air channel W2 join the air currents flowing through the air channel W1, and the combined air currents flow into the frame 21, providing a cooling effect through rotation of the impeller 211.

Thus since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalency of the claims are intended to be embraced therein.

What is claimed is:

1. A cooling system for a hand-held electronic device, comprising:
    a casing including a compartment, at least one air inlet in communication with the compartment, and at least one air outlet in communication with the compartment;
    a wind driving assembly mounted in the compartment, with the wind driving assembly including a frame, a package and a thermally conductive cover, with the thermally conductive cover engaged with the frame and the package, with an impeller rotatably mounted in the frame, with the frame including an outlet hole adjacent to the at least one air outlet of the casing, with the package adapted to receive at least one electronic element, with the at least one electronic element generating heat during operation, and with the thermally conductive cover including an inlet hole in communication with an interior of the frame; and
    an auxiliary fan mounted in the casing and including an inlet hole and an outlet hole, with the inlet hole of the auxiliary fan located adjacent to the at least one air inlet of the casing, with an air guiding gap formed between the auxiliary fan and the package, and with the air guiding gap adjoining the outlet hole of the auxiliary fan,
    wherein an air channel is formed between the thermally conductive cover and an interior wall face of the casing, and the at least one air inlet of the casing intercommunicates with the inlet hole of the thermally conductive cover via the air channel,
    with the wind driving assembly including a side adjacent to the auxiliary fan, with the side of the wind driving assembly including an airflow guiding portion, and with the airflow guiding portion being an inclined face.

2. The cooling system for a hand-held electronic device as claimed in claim 1, wherein the frame and the package adjoin each other and are located side by side, and the thermally conductive cover integrally extends from the frame to the package.

3. The cooling system for a hand-held electronic device as claimed in claim 1, wherein the frame and the package adjoin each other and are located side by side, and the thermally conductive cover integrally extends from the package to the frame.

4. The cooling system for a hand-held electronic device as claimed in claim 1, further comprising: an auxiliary thermally conductive cover mounted to a side of the frame opposite to the thermally conductive cover, with an auxiliary air channel formed between the auxiliary thermally conductive cover and the interior wall face of the casing, with the frame further including at least one auxiliary inlet hole, with the at least one auxiliary inlet hole intercommunicating with the at least one air inlet of the casing via the auxiliary air channel, and with the auxiliary thermally conductive cover including at least one through-hole aligned with the at least one auxiliary inlet hole.

5. The cooling system for a hand-held electronic device as claimed in claim 4, further comprising: a conduit connected to the frame, with the conduit connected between the outlet hole of the frame and the at least one air outlet of the casing.

6. The cooling system for a hand-held electronic device as claimed in claim 4, with the auxiliary thermally conductive cover including a surface coated with a far infrared powder coating or a powder coating of negative ions.

7. The cooling system for a hand-held electronic device as claimed in claim 1, further comprising: a conduit connected to the frame, with the conduit connected between the outlet hole of the frame and the at least one air outlet of the casing.

8. The cooling system for a hand-held electronic device as claimed in claim 1, with the thermally conductive cover including a surface coated with a far infrared powder coating or a powder coating of negative ions.

9. The cooling system for a hand-held electronic device as claimed in claim 1, with the side of the wind driving assembly further including another inclined face opposite to the inclined face.

10. A cooling system for a hand-held electronic device, comprising:
    a casing including a compartment, at least one air inlet in communication with the compartment, and at least one air outlet in communication with the compartment;
    a wind driving assembly mounted in the compartment, with the wind driving assembly including a frame, a package and a thermally conductive cover, with the thermally conductive cover engaged with the frame and the package, with an impeller rotatably mounted in the frame, with the frame including an outlet hole adjacent to the at least one air outlet of the casing, with the package adapted to receive at least one electronic element, with the at least one electronic element generating heat during operation, and with the thermally conductive cover including an inlet hole in communication with an interior of the frame; and
    an auxiliary fan mounted in the casing and including an inlet hole and an outlet hole, with the inlet hole of the auxiliary fan located adjacent to the at least one air inlet of the casing, with an air guiding gap formed between the auxiliary fan and the package, and with the air guiding gap adjoining the outlet hole of the auxiliary fan,
    wherein an air channel is formed between the thermally conductive cover and an interior wall face of the casing, and the at least one air inlet of the casing intercommunicates with the inlet hole of the thermally conductive cover via the air channel, with the wind driving assembly including a side adjacent to the auxiliary fan, with the side of the wind driving assembly including an airflow guiding portion, and with the airflow guiding portion being an arc-like face.

11. The cooling system for a hand-held electronic device as claimed in claim 10, further comprising: an auxiliary thermally conductive cover mounted to a side of the frame opposite to the thermally conductive cover, with an auxiliary air channel formed between the auxiliary thermally conductive cover and the interior wall face of the casing, with each of the thermally conducting cover and the auxiliary thermally conducting cover having at least one airflow guiding hole located in an adjoining area between the frame and the package.

12. The cooling system for a hand-held electronic device as claimed in claim 11, with the side of the wind driving assembly further including another arc-like face opposite to the arc-like face.

13. The cooling system for a hand-held electronic device as claimed in claim 11, with the casing further including another side having an auxiliary air inlet and an auxiliary air outlet, with the auxiliary air inlet aligned with the auxiliary fan, with the auxiliary air outlet aligned with the frame, and with the frame including an auxiliary outlet hole aligned with the auxiliary air outlet.

14. A cooling system for a hand-held electronic device, comprising:

a casing including a compartment, at least one air inlet in communication with the compartment, and at least one air outlet in communication with the compartment;

a wind driving assembly mounted in the compartment, with the wind driving assembly including a frame, a package and a thermally conductive cover, with the frame, the package and the thermally conductive cover integrally formed as a housing of the wind driving assembly, with an impeller rotatably mounted in the frame, with the frame including an outlet hole adjacent to the at least one air outlet of the casing, with the package adapted to receive at least one electronic element, with the at least one electronic element generating heat during operation, and with the thermally conductive cover including an inlet hole in communication with an interior of the frame; and an auxiliary fan mounted in the casing and including an inlet hole and an outlet hole, with the inlet hole of the auxiliary fan located adjacent to the at least one air inlet of the casing, with an air guiding gap formed between the auxiliary fan and the package, and with the air guiding gap adjoining the outlet hole of the auxiliary fan, wherein an air channel is formed between the thermally conductive cover and an interior wall face of the casing, and the at least one air inlet of the casing intercommunicates with the inlet hole of the thermally conductive cover via the air channel, with the wind driving assembly including a side adjacent to the auxiliary fan, with the side of the wind driving assembly including an airflow guiding portion, and with the airflow guiding portion being an inclined face.

15. The cooling system for a hand-held electronic device as claimed in claim 14, further comprising: an auxiliary thermally conductive cover mounted to a side of the frame opposite to the thermally conductive cover, with an auxiliary air channel formed between the auxiliary thermally conductive cover and the interior wall face of the casing, with the frame further including at least one auxiliary inlet hole, with the at least one auxiliary inlet hole intercommunicating with the at least one air inlet of the casing via the auxiliary air channel, and with the auxiliary thermally conductive cover including at least one through-hole aligned with the at least one auxiliary inlet hole.

16. The cooling system for a hand-held electronic device as claimed in claim 15, with the auxiliary thermally conductive cover including a surface coated with a far infrared powder coating or a powder coating of negative ions.

17. The cooling system for a hand-held electronic device as claimed in claim 14, further comprising: a conduit connected to the frame, with the conduit connected between the outlet hole of the frame and the at least one air outlet of the casing.

18. The cooling system for a hand-held electronic device as claimed in claim 14, with the side of the wind driving assembly further including another inclined face opposite to the inclined face.

19. The cooling system for a hand-held electronic device as claimed in claim 14, with the thermally conductive cover including a surface coated with a far infrared powder coating or a powder coating of negative ions.

20. A cooling system for a hand-held electronic device, comprising:

a casing including a compartment, at least one air inlet in communication with the compartment, and at least one air outlet in communication with the compartment;

a wind driving assembly mounted in the compartment, with the wind driving assembly including a frame, a package and a thermally conductive cover, with the frame, the package and the thermally conductive cover integrally formed as a housing of the wind driving assembly, with an impeller rotatably mounted in the frame, with the frame including an outlet hole adjacent to the at least one air outlet of the casing, with the package adapted to receive at least one electronic element, with the at least one electronic element generating heat during operation, and with the thermally conductive cover including an inlet hole in communication with an interior of the frame; and an auxiliary fan mounted in the casing and including an inlet hole and an outlet hole, with the inlet hole of the auxiliary fan located adjacent to the at least one air inlet of the casing, with an air guiding gap formed between the auxiliary fan and the package, and with the air guiding gap adjoining the outlet hole of the auxiliary fan, wherein an air channel is formed between the thermally conductive cover and an interior wall face of the casing, and the at least one air inlet of the casing intercommunicates with the inlet hole of the thermally conductive cover via the air channel, with the wind driving assembly including a side adjacent to the auxiliary fan, with the side of the wind driving assembly including an airflow guiding portion, and with the airflow guiding portion being an arc-like face.

21. The cooling system for a hand-held electronic device as claimed in claim 20, further comprising: an auxiliary thermally conductive cover mounted to a side of the frame opposite to the thermally conductive cover, with an auxiliary air channel formed between the auxiliary thermally conductive cover and the interior wall face of the casing, with each of the thermally conducting cover and the auxiliary thermally conducting cover having at least one airflow guiding hole located in an adjoining area between the frame and the package.

22. The cooling system for a hand-held electronic device as claimed in claim 21, with the side of the wind driving assembly further including another arc-like face opposite to the arc-like face.

23. The cooling system for a hand-held electronic device as claimed in claim 21, with the casing further including another side having an auxiliary air inlet and an auxiliary air outlet, with the auxiliary air inlet aligned with the auxiliary fan, with the auxiliary air outlet aligned with the frame, and with the frame including an auxiliary outlet hole aligned with the auxiliary air outlet.

* * * * *